US006753740B2

(12) United States Patent
Gauthier et al.

(10) Patent No.: US 6,753,740 B2
(45) Date of Patent: Jun. 22, 2004

(54) METHOD AND APPARATUS FOR CALIBRATION OF A POST-FABRICATION BIAS VOLTAGE TUNING FEATURE FOR SELF BIASING PHASE LOCKED LOOP

(75) Inventors: Claude Gauthier, Fremont, CA (US); Brian W. Amick, Austin, TX (US); Pradeep Trivedi, Sunnyvale, CA (US); Dean Liu, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 64 days.

(21) Appl. No.: 10/147,593

(22) Filed: May 17, 2002

(65) Prior Publication Data

US 2003/0214362 A1 Nov. 20, 2003

(51) Int. Cl.[7] .................................................. H03B 1/00
(52) U.S. Cl. ........................ 331/185; 331/17; 331/185; 327/146
(58) Field of Search .................................. 327/146, 148, 327/155, 157; 331/17, 25, 34, 185; 375/374, 375, 376

(56) References Cited

U.S. PATENT DOCUMENTS 5,289,516 A * 2/1994 Kimura et al. ............. 377/39
5,986,485 A * 11/1999 O'Sullivan ................. 327/156
5,986,514 A * 11/1999 Salvi et al. .................. 331/17
6,043,717 A * 3/2000 Kurd .......................... 331/17
6,405,278 B1 * 6/2002 Liepe .......................... 711/103

OTHER PUBLICATIONS

"Low–Jitter Process–Independent DLL and PLL Based on Self–Biased Techniques," by John G. Maneatis, IEEE Journal of Solid–State Circuits, vol. 31, No. 11, Nov. 1996 (10 pages).

* cited by examiner

Primary Examiner—Linh M. Nguyen
(74) Attorney, Agent, or Firm—Rosenthal & Osha L.L.P.

(57) ABSTRACT

A calibration and adjustment system for post-fabrication control of a phase locked loop bias-generator is provided. The calibration and adjustment system includes an adjustment circuit operatively connected to the bias-generator, where the adjustment circuit is controllable to facilitate a modification of a voltage output by the bias-generator. Such control of the voltage output by the bias-generator allows a designer to achieve a desired phase locked loop performance characteristic after the phase locked loop has been fabricated. A representative value of the amount of adjustment desired in the bias-generator output may be stored and subsequently read to adjust the phase locked loop.

22 Claims, 8 Drawing Sheets

METHOD AND APPARATUS FOR CALIBRATION OF A POST-FABRICATION BIAS VOLTAGE TUNING FEATURE FOR SELF BIASING PHASE LOCKED LOOP

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as SYS_CLK) to various parts of the computer system (10). Modem microprocessors and other integrated circuits, however, are typically capable of operating at frequencies significantly higher than the system clock signal, and thus, it becomes important to ensure that operations involving the microprocessor (12) and the other components of the computer system (10) use a proper and accurate reference of time.

One component used within the computer system (10) to ensure a proper reference of time among a system clock signal and a microprocessor clock signal, i.e., "chip clock signal," is a type of clock generator known as a phase locked loop (PLL) (20). The PLL (20) is an electronic circuit that controls an oscillator such that the oscillator maintains a constant phase relative to a system signal. Referring to FIG. 1, the PLL (20) has as its input the system clock signal, which is its reference signal, and outputs a chip clock signal (shown in FIG. 1 as CHIP_CLK) to the microprocessor (12). The system clock signal and chip clock signal have a specific phase and frequency relationship controlled by the PLL (20). This relationship between the phases and frequencies of the system clock signal and chip clock signal ensures that the various components within the microprocessor (12) use a controlled and accounted for reference of time. When this relationship is not maintained by the PLL (20), however, the operations within the computer system (10) become non-deterministic.

FIG. 2 shows a block diagram of a representative PLL (200). The PLL (200) includes a PLL core (201), buffers (212, 214), and a feedback loop that includes a divide by N block (216). The PLL core (201) aligns the transition edge and frequency of the system clock signal (SYS_CLK) and a feedback loop signal (219). The PLL core (201) adjusts its output frequency in order to zero any phase and frequency difference between the system clock signal (SYS_CLK) and the feedback loop signal (219). The addition of the divide by N block (216) in the feedback loop enables the PLL core (201) to multiply the system clock signal (SYS_CLK). Multiplying the system clock signal is useful when the chip clock signal (CHIP_CLK) must have a higher frequency than the system clock signal (SYS_CLK). By adding the divide by N block (216), the chip clock signal (CHIP_CLK) frequency should be N times faster to allow the phase and frequency difference between the system clock signal (SYS_CLK) and the feedback loop signal (219) to zero. The PLL (200) may also have buffers (212, 214) to drive a larger resistive and/or capacitive load. The buffers (212, 214) are in the feedback loop so that the delay created by the buffers (212, 214) is zeroed by the PLL core (201).

The PLL core (201) adjusts the phase and frequency difference between the system clock signal (SYS_CLK) and the feedback loop signal (219). The system clock signal (SYS_CLK) and the feedback loop signal (219) are used as inputs to a phase-frequency detector (202). The phase-frequency detector (202) measures whether the phase and frequency difference between the system clock signal (SYS_CLK) and the feedback loop signal (219) are correct. The phase-frequency detector (202) produces signals that control charge pumps (204, 234). The phase-frequency detector (202) controls the charge pumps (204, 234) to increase or decrease their output using control signals up, U (203), and down, D (205). The charge pump (204) adds or removes charge from a capacitor, $C_1$ (206), that changes the DC value at the input of a bias-generator (208). The capacitor, $C_1$ (206), is connected between a power supply, $V_{DD}$, and an input voltage, $V_{CTRL}$ (207). The charge pump (234) adds or removes charge from an output, $V_{BP}$ (209), of a bias-generator (208).

The bias-generator (208) produces control voltages, $V_{BP}$ (209) and $V_{BN}$ (211), in response to the input voltage, $V_{CTRL}$ (207). The PLL core (201) may be self-biased by adding the charge pump (234) to the bias-generator (208) output, $V_{BP}$ (209). The addition of a second charge pump (234) allows the removal of a resistor in series with the capacitor $C_1$ (206). A voltage-controlled oscillator (210) produces an output that has a frequency related to the control voltages, $V_{BP}$ (209) and $V_{BN}$ (211). The output (213) from the voltage-controlled oscillator, after being buffered by the buffers (212, 214), provides a frequency, N times as fast as the system clock signal (SYS_CLK), to other circuits. Ideally, the chip clock signal (CHIP_CLK) output is a constant multiple by N of the system clock signal (SYS_CLK) input. The chip clock signal (CHIP_CLK), however, may be affected by jitter.

One common performance measure for a PLL is jitter. Jitter is the time domain error from poor spectral purity of an output. In other words, in a repeated output pattern, such as a clock signal, a transition that occurs from one state to another does not occur at the same time relative to other transitions. Jitter represents the perturbations that result in the intermittent shortening or lengthening of signal elements of an output. The system clock signal may have jitter that needs to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that system clock signal jitter is filtered. Power supply noise will, however, have a certain noise-versus-frequency characteristic. The PLL loop bandwidth may need to be increased to recover from the generation of chip clock signal jitter caused by power supply noise.

SUMMARY OF INVENTION

According to one aspect of the present invention, an integrated circuit comprises a clock path for carrying a clock signal; a power supply path adapted to receive power from a power supply; a phase locked loop connected to the power supply path comprises a voltage-controlled oscillator for generating a frequency signal dependent on an input thereto, a phase-frequency detector for detecting a phase difference between the clock signal and the frequency signal, and a bias-generator arranged to output a voltage to an input of the voltage-controlled oscillator responsive to the phase-frequency detector; an adjustment circuit operatively connected to the input of the voltage-controlled oscillator where the adjustment circuit is responsive to control information to adjust the voltage output by the bias-generator; and a storage device adapted to store the control information to which the adjustment circuit is responsive.

According to one aspect of the present invention, a method for post-fabrication treatment of a phase locked loop comprises generating a frequency signal; comparing the frequency signal to a clock signal; adjusting the generating based on the comparing using a bias-generator; generating a binary control word; selectively adjusting an output of the bias-generator in the phase locked loop dependent on the binary control word; operating the phase locked loop where the selectively adjusting the output of the bias-generator modifies an operating characteristic of the phase locked loop; and storing control information determined from the adjusting.

According to one aspect of the present invention, an integrated circuit comprises phase locked loop means for generating a frequency signal where the phase locked loop means comprises means for generating the frequency signal, means for comparing the frequency signal to a clock signal, means for adjusting the generating based on the comparing using a bias-generator, means for generating a binary control word, adjusting means for adjusting an output of the bias-generator in the phase locked loop dependent on the binary control word, means for operating the phase locked loop where the adjusting means modifies an operating characteristic of the phase locked loop; and storing means for storing control information determined using the adjusting means.

Other aspects and advantages of the invention will be apparent from the following description and the appended claims.

DETAILED DESCRIPTION

Figure 1:
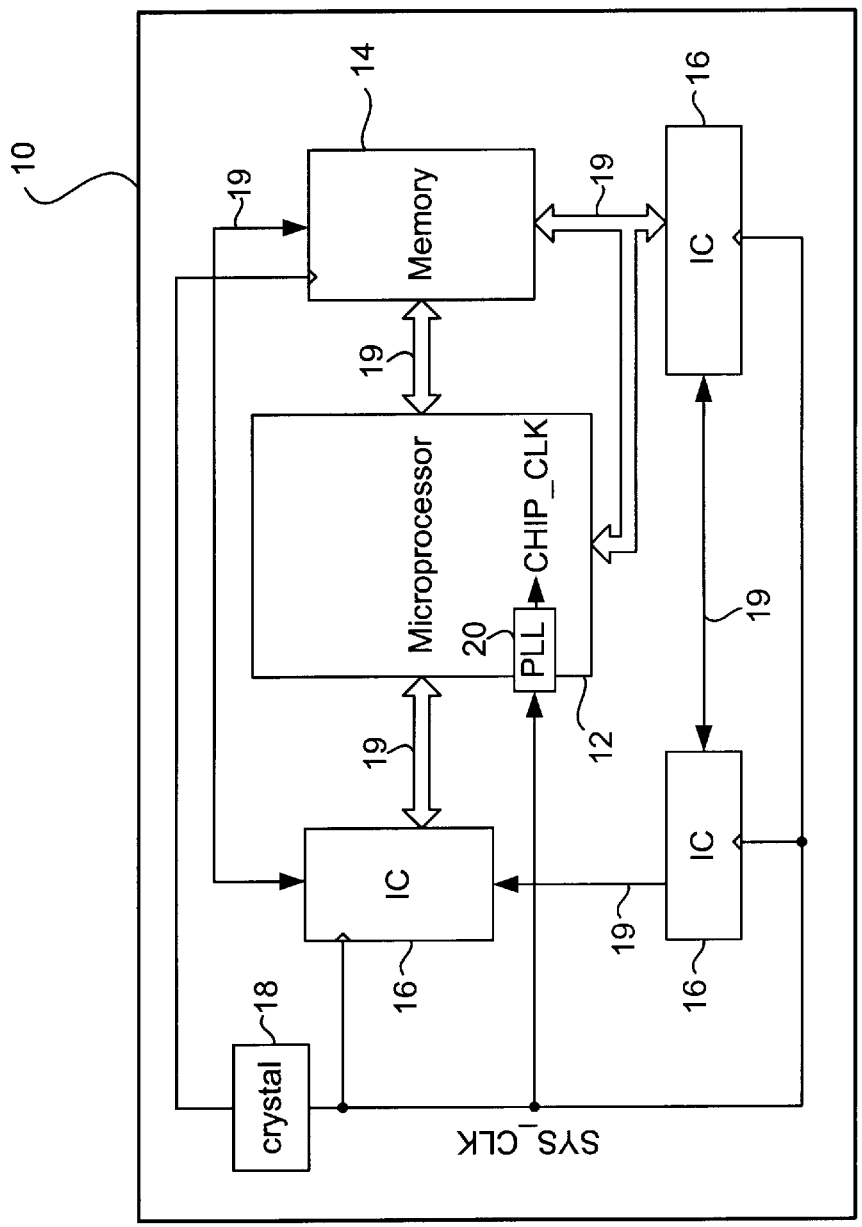
FIG. 1 shows a typical computer system component.

Exemplary embodiments of the invention will be described with reference to the accompanying drawings. Like items in the drawings are shown with the same reference numbers throughout several figures for consistency.

Embodiments of the present invention relate to an adjustment and calibration system for post-fabrication adjustment of a phase locked loop bias-generator. The adjustment and calibration system includes an adjustment circuit that may change a nominal voltage produced on the output of the bias-generator. The adjustment circuit has a wired-OR connection to an output of the bias-generator. The change in voltage produced on the output of the bias-generator adjusts the voltage to the input of the voltage-controlled oscillator. The adjustment circuit allows modification of the output of the bias-generator, and consequently adjusts an operating characteristic of the phase locked loop. The adjustment and calibration system may also store control information representative of the desired amount of adjustment of the output of the bias-generator. The control information may be read and the adjustment circuit adjusted by a test processor unit.

In a PLL, several operating characteristics may be important indicators of good performance. For example, operating characteristics such as a PLL's response to jitter, the minimum and maximum system clock signal frequency, and/or the minimum and maximum chip clock signal frequency may be important considerations for designers. The ability to ensure the desired operating characteristics after the PLL is fabricated is not always possible.

For example, jitter can be a function of various parameters: power supply variation, input and output jitter, loop bandwidth, substrate noise, etc. Although a designer may intend for an integrated circuit to have particular values for these parameters, actual values for these parameters are typically unknown until the integrated circuit has been fabricated (i.e., in a post-fabrication stage). For example, a designer may intend for the loop bandwidth of the PLL to be within in a particular range. The loop bandwidth may be unintentionally affected by many factors in the fabrication process. Because the loop bandwidth cannot be redesigned in the post-fabrication stage without considerable temporal and monetary expenditures, these fabrication factors may cause the PLL to have a different loop bandwidth range than the range it was designed to have and therefore may have poor jitter performance.

Figure 2:
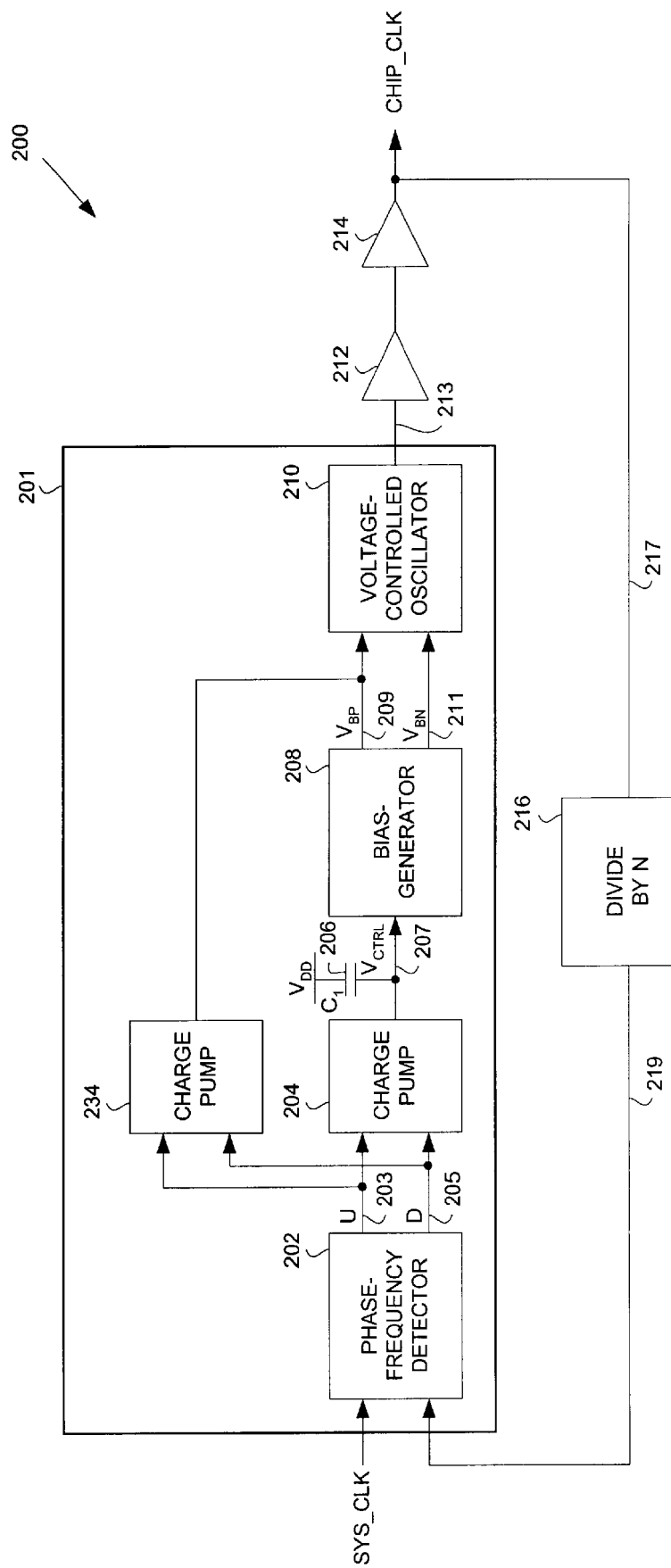
FIG. 2 shows a prior art phase locked loop block diagram.

In FIG. 2, the frequency response of the representative PLL (200) may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The charge pumps (204, 234) add or remove charge to its output depending on the state of input control signals, typically up, U (203), or down, D (205), pulses. Both pulses may be "on" at the same time, however, if the up or the down pulse remains "on" longer than the other, the net charge at the output of the charge pumps (204, 234) increase or decrease.

The charge pump gain may be modeled as a linear gain versus phase error. The phase error is the output of the phase-frequency detector (202). The Laplace transform of the output of the charge pump (204), $I_{OUT}$, versus the input to the charge pump from the phase-frequency detector (202) (i.e., phase error), $\Phi_E(s)$, is $I_{OUT}(s)/\Phi_E(s)=I_{CP}/2\pi$, where $I_{CP}$ is the current generated by the charge pump (204).

For modeling purposes, the charge pump (234) may be replaced by a resistor, R, in series with the capacitor $C_1$ (206). A loop filter may include the capacitor, $C_1$ (206), and series resistor R (not shown) connected from $I_{OUT}$ to $V_{DD}$. The loop filter transforms the output of the charge pump, $I_{OUT}$, into the bias-generator input voltage, $V_{CTRL}$. The Laplace transform of the series resistor and capacitor in the loop filter is $V_{CTRL}(s)/I_{OUT}(s)=(sRC_1+1)/(sC_1)$. The transfer function of the capacitor and resistor shows that a zero is added that adds stability to the PLL feedback loop. The bias-generator (208) produces control voltages, $V_{BP}$ (209) and $V_{BN}$ (211), in response to the input voltage, $V_{CTRL}$ (207). $V_{BP}$ (209) is generally equal to $V_{CTRL}$ (207). Any deviation from the ideal value of one may need to be corrected.

The voltage-controlled oscillator (210) outputs a chip clock signal that has a frequency proportional to the net effect of the control voltages, $V_{BP}$ (209) and $V_{BN}$ (211). The Laplace transform of the voltage-controlled oscillator (210) from the bias-generator input voltage, $V_{CTRL}$, is $\Phi_{OUT}(s)/V_{CTRL}(s) = K_{VCO}/s$.

The closed-loop transfer function can now be derived as $H(s) = \Phi_{OUT}(s)/\Phi_{IN}(s) = [(RK_{VCO}I_{CP}/2\pi)/(s+1/RC_1)]/[s^2 + sRC_1 K_{VCO}I_C/2NC + K_{VCO}I_{CP}/2\pi NC]$. H(s) is a second order system that has one pole from the loop filter and one pole from the voltage-controlled oscillator (210), and one zero from the resistor, R, in the loop filter. The transfer function H(s) has a natural frequency $\omega_n = (K_{VCO}I_{CP}/2\pi NC_1)^{0.5}$ and a damping factor $\zeta = RC_1 \omega_n/2$.

The loop bandwidth is defined as the frequency at which the output magnitude is 3 dB lower than when the input is DC. Loop bandwidth is not the same as natural frequency, although they are often close. Low loop bandwidth allows the PLL to filter input jitter. High loop bandwidth allows the PLL to follow and compensate for output jitter induced by power supply noise. A design tradeoff must be made in the loop bandwidth of the PLL. Optimizing the PLL loop bandwidth relates to balancing the effect of input jitter with the response speed of the PLL loop to compensate for output jitter induced by power supply noise.

Figure 3:
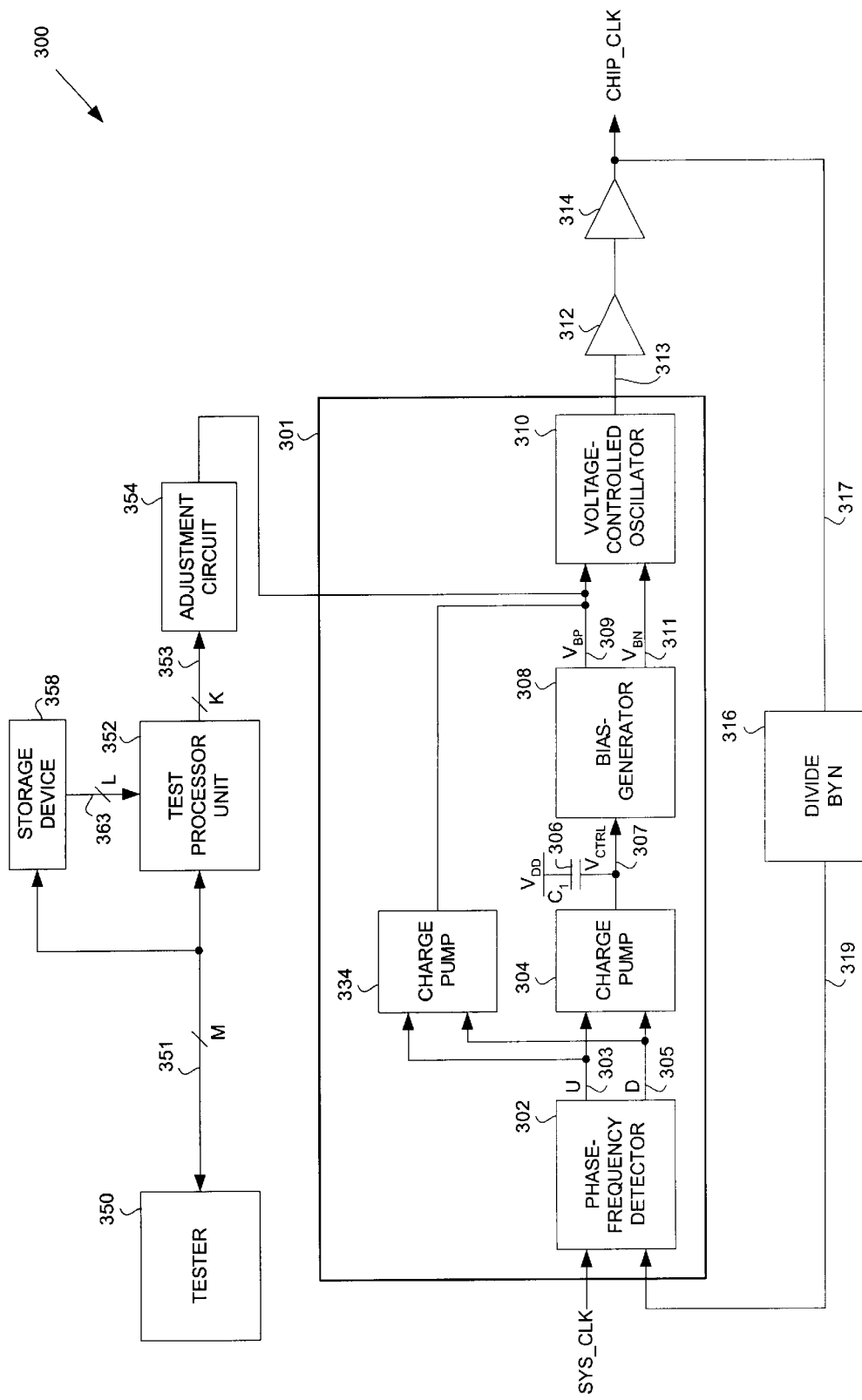
FIG. 3 shows an adjustable phase locked loop with a storage device block diagram in accordance with an embodiment of the present invention.

FIG. 3 shows an embodiment of an adjustable PLL (300) in accordance with the invention. The adjustable PLL (300) may include a PLL core (301), buffers (312, 314), and feedback loop with a divide by N block (316) in the feedback loop. An adjustment circuit (354) controlled by a test processor unit (352), and a storage device (358) are also added. The adjustment circuit (354) may be designed similar to the exemplary adjustment circuit (500) shown in FIG. 5. The phase-frequency detector (302), charge pumps (304, 334), capacitor $C_1$ (306), bias-generator (308) and voltage-controlled oscillator (310) of the adjustable PLL (300) may operate similarly to the PLL (200 in FIG. 2) as previously described.

In FIG. 3, the test processor unit (352) generates a binary control word that determines the settings of the adjustment circuit (354). The test processor unit (352) controls the adjustment circuits (354) using multiple adjustment signals K (353) to form the binary control word. The values of the multiple adjustment signals K (353) are determined by the test processor unit (352). The test processor unit (352) may communicate through a host interface (not shown) using M communication lines (351). Those with ordinary skill in the art will appreciate that the host interface and M communication lines (351) may take a wide variety of forms. The host interface may be operatively connected to a separate computer system. The communication may be defined by an industry standard.

The host interface (not shown) may be used to operatively connect to a separate computer system. For example, a tester (350) may communicate with the test processor unit (352). The tester (350) may instruct the test processor unit (352) to adjust adjustment circuit (354) to modify an operating characteristics of the adjustable PLL (300). The tester (350) may measure an operating characteristic of the adjustable PLL (300) or a representative operating characteristic of an integrated circuit on which the adjustable PLL (300) resides to determine the effect of the adjustment. A variety of different adjustments may be made in an effort to identify the adjustment settings that produce the desired operating characteristics of the adjustable PLL (300).

For example, the tester (350) may be used to adjust the adjustable PLL (300) until the optimal signal clock signal jitter performance is achieved. The tester (350) may also be used to adjust the adjustable PLL (300) until the optimal power supply jitter performance is achieved. Also, the tester (350) may be used to adjust the adjustable PLL (300) until the operating characteristics of the adjustable PLL (300) reaches a desired performance level. The operating characteristics may include jitter response, maximum operating frequency, minimum operating frequency, lock time, etc.

The storage device (358) may be designed to store control information representative of the adjustment settings that produce the desired operating characteristics of the adjustable PLL (300). Using the tester (350), control information may be written into the storage device (358). The tester (350) may read or rewrite the control information in the storage device (358).

The storage device (358) may include multiple storage elements such that the control information may be represented by a binary word. For example, the control information stored in the storage device (358) may be a binary word that matches the values of the multiple adjustment signals K (353). Alternatively, the control information may be a binary encoded word. For example, if the multiple adjustment signals K (353) used eight control signals, the control information might be represented with a three bit binary word. Alternatively, the control information may contain instructions, interpreted by the test processor unit (352), to control the multiple adjustment signals K (353).

In FIG. 3, the tester (350) may be removed from the adjustable PLL (300), or the integrated circuit on which the adjustable PLL (300) resides. The test processor unit (352) may read the storage device (358) to obtain the control information and determine the amount of adjustment that should occur in adjustment circuit (354). The adjustable PLL (300), after the test processor unit (352) reads the control information in the storage device (358) and adjusts the adjustment circuit (354), may have an operating characteristic similar to the operating characteristics obtained while connected to the tester (350). The test processor unit (352) reads the control information from storage device (358) using the L signal lines (363).

The output of the adjustment circuit (354) is connected to the control voltage, $V_{BP}$ (309), using a wired-OR connection. The control voltage, $V_{BP}$ (309), is generated as an output from the bias-generator (308) and enabled as a self-biased output by the charge pump (334). Depending on the binary control word from the test processor unit (352), multiple adjustment signals K (353) adjust the output of the adjustment circuit (354). An adjustment on control voltage $V_{BP}$ (309) may modify an operating characteristic of the adjustable PLL (300).

One of ordinary skill in the art will appreciate that even though the adjustment circuit (354) may be connected to the control voltage, $V_{BP}$ (309), of the bias-generator (308), the adjustment circuit (354) may be turned "off." The adjustment circuit (354) may not have an effect on the adjustable PLL (300). Further, those skilled in the art will appreciate that the adjustable PLL (300) may be analog, digital, or a combination of both types of circuits.

Figure 4:
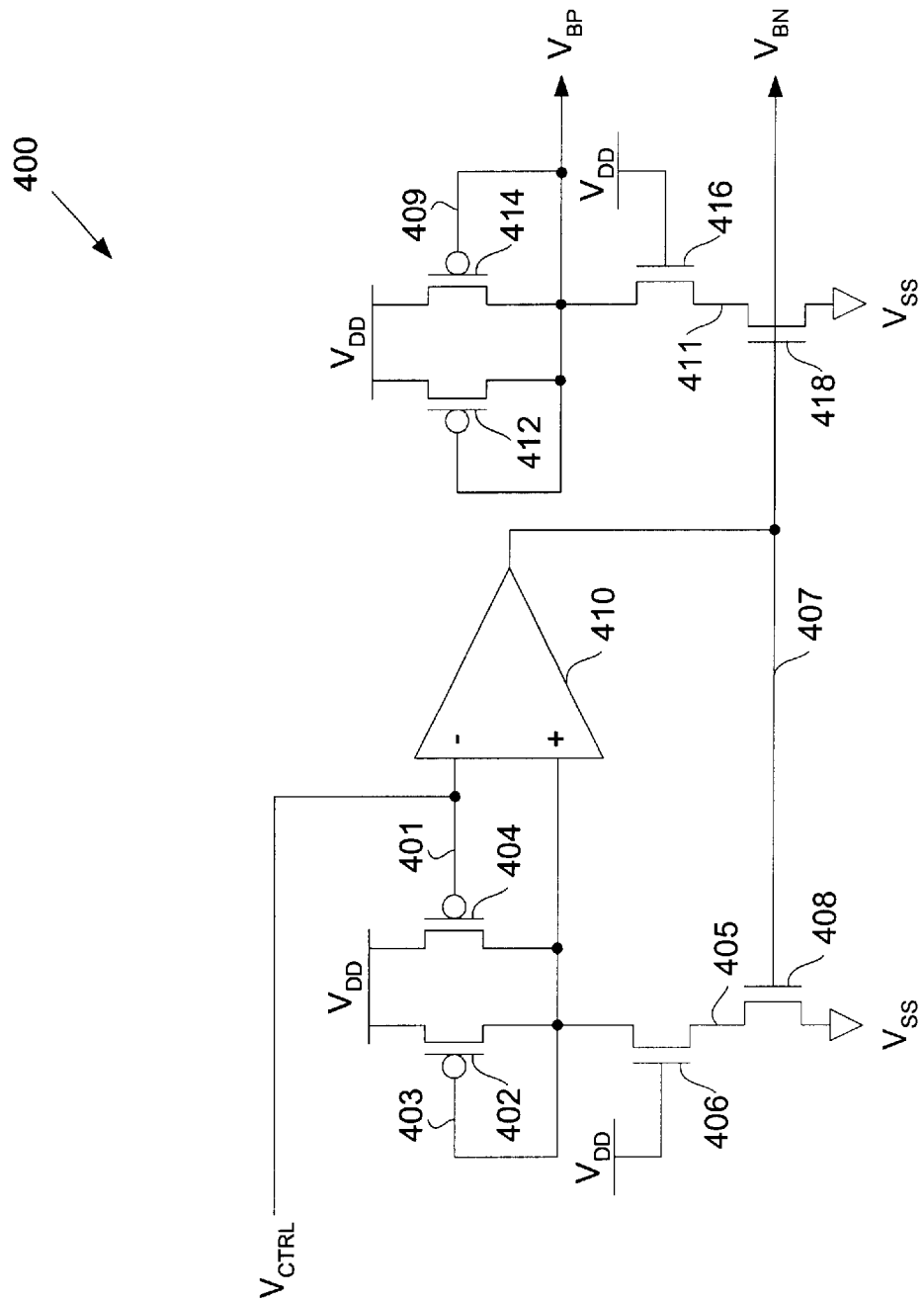
FIG. 4 shows a bias-generator circuit diagram in accordance with an embodiment of the present invention.

FIG. 4 shows a bias-generator circuit (400) in accordance with an embodiment of the present invention. The input voltage, $V_{CTRL}$ (307), in FIG. 3 is the input to the bias-generator circuit (400). The bias-generator (400) produces control voltages, $V_{BP}$ (409) and $V_{BN}$ (407), in response to the input voltage, $V_{CTRL}$ (401). The input voltage, $V_{CTRL}$ (401), is input to a comparator (410) and the gate of a p-channel transistor (404). P-channel transistors (402, 404) form a differential pair where p-channel transistor (402) is diode connected using signal (403). Signal (403) is also connected to the comparator (410). The comparator (410) adjusts its output, control voltage $V_{BN}$ (407), to create a zero voltage difference between input voltage, $V_{CTRL}$ (401), and signal (403).

The control voltage $V_{BN}$ (407) adjusts the current flow through n-channel transistors (408, 418). N-channel transistors (406, 416) provides resistive elements, as their gates are connected to $V_{DD}$. P-channel transistors (412, 414) form another differential pair where p-channel transistors (412, 414) are both diode connected using control voltage, $V_{BP}$ (409). The control voltage, $V_{BP}$ (409), may have a nominal voltage similar in value to the input voltage, $V_{CTRL}$ (401). Due to process variations during manufacture or simulation modeling different from the physical transistors, the control voltage, $V_{BP}$ (409), may not have a similar voltage value, i.e., offset, to the input voltage, $V_{CTRL}$ (401). The adjustment circuit (500) in FIG. 5 provides a means to correct the offset.

Those skilled in the art will appreciate that the bias-generator circuit (400) shows a circuit arrangement in which the control voltage, $V_{BP}$ (409), may have a nominal voltage similar in value to the input voltage, $V_{CTRL}$ (401). A bias-generator may also be designed such that the control voltage, $V_{BN}$ (407), may have a nominal voltage similar in value to the input voltage, $V_{CTRL}$ (401). In this arrangement, the control voltage, $V_{BP}$ (409), may be representative of a voltage necessary to create a zero voltage difference between two inputs to a comparator. In this arrangement, the adjustment circuit (354) in FIG. 3 may have its output connected to the control voltage, $V_{BN}$ (407), in FIG. 4, instead of the control voltage, $V_{BP}$ (409). The ability to adjust the adjustable PLL (300) in FIG. 3 with this arrangement is expected to be similar to the ability to adjust the adjustable PLL (300) in FIG. 3 using the bias-generator circuit (400) shown in FIG. 4.

Figure 5:
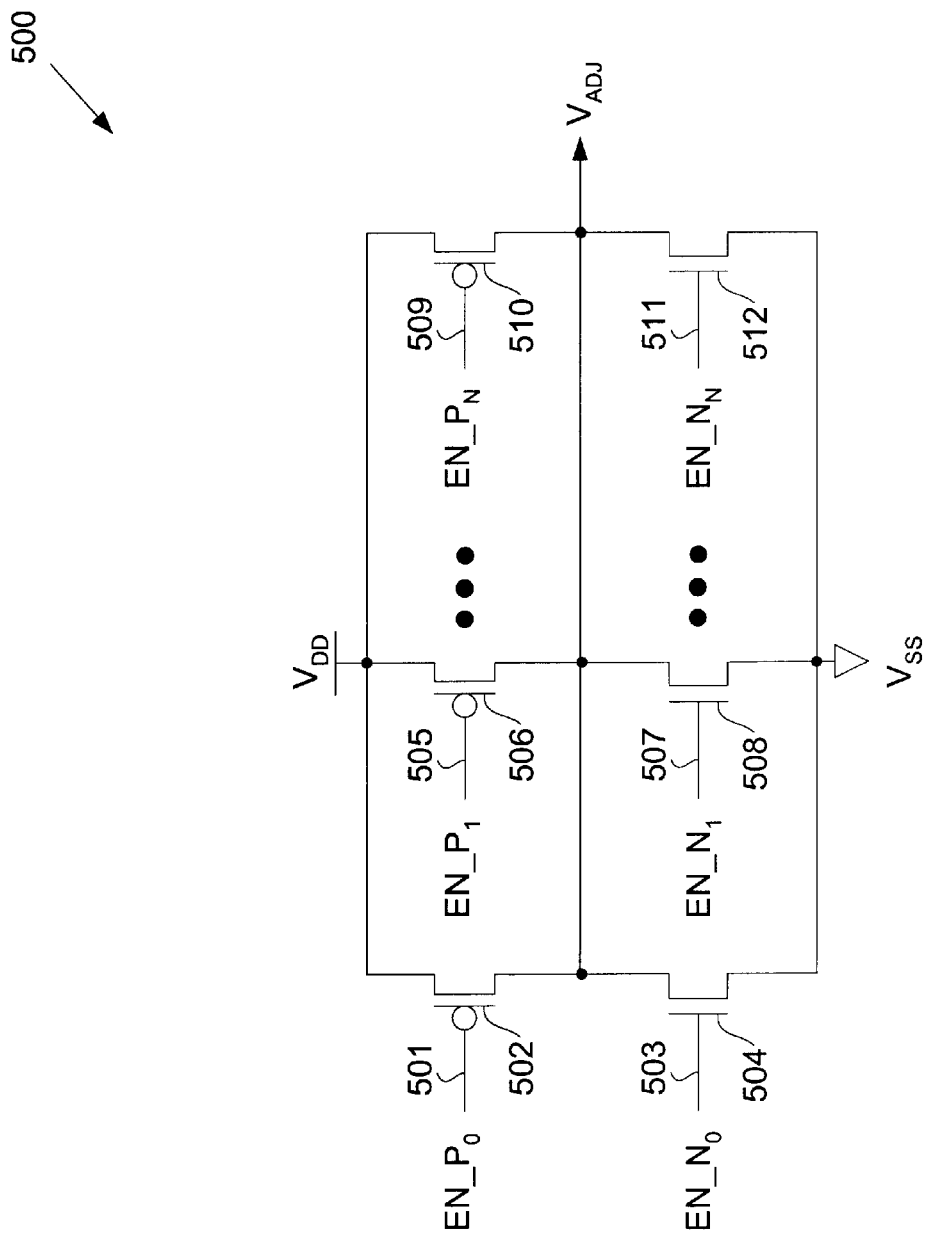
FIG. 5 shows an adjustment circuit diagram in accordance with an embodiment of the present invention.

FIG. 5 shows an embodiment in accordance with the invention. An adjustment circuit (500) may include multiple p-channel transistors (502, 506, 510) arranged in parallel with each other. The multiple p-channel transistors (502, 506, 510) connect between the power supply $V_{DD}$ and a common node, $V_{ADJ}$. The adjustment circuit also includes multiple n-channel transistors (504, 508, 512) arranged in parallel with each other. The multiple n-channel transistors (504, 508, 512) connect between ground, $V_{SS}$, and a common node, $V_{ADJ}$.

Each transistor may have an individual control signal to turn "on" or "off" one or more of the p-channel transistors (502, 506, 510) or n-channel transistors (504, 508, 512). The p-channel transistors (502, 506, 510) have control signals EN_$P_0$ (501), EN_$P_1$ (505), and EN_$P_N$ (509) connected to their gates, respectively. The n-channel transistors (504, 508, 512) have control signals EN_$N_0$ (503), EN_$N_1$ (507), and EN_$N_N$ (511) connected to their gates, respectively. A low voltage on any of the EN_$P_X$ signals (501, 505, 509) will turn "on" their respective p-channel transistors (502, 506, 510). A high voltage on any of the EN_$N_X$ signals (503, 507, 511) will turn "on" their respective n-channel transistors (504, 508, 512).

Any p-channel transistor (502, 506, 510) that is "on" will change the voltage on $V_{ADJ}$ toward $V_{DD}$. Any n-channel transistor (504, 508, 512) that is "on" will change the voltage on $V_{ADJ}$ toward $V_{SS}$. By selecting which p-channel transistors (502, 506, 510) and/or n-channel transistors (504, 508, 512) are 'on', a change in the voltage on $V_{ADJ}$ may be achieved.

Those with ordinary skill in the art will appreciate that the p-channel transistors (502, 506, 510) and n-channel transistors (504, 508, 512) may be turned "on" individually or as a group. The p-channel transistors (502, 506, 510) and n-channel transistors (504, 508, 512) may be sized so that one or more of the transistors has a different effect than that of the other transistors. The gate widths of the p-channel transistors (502, 506, 510) and n-channel transistors (504, 508, 512) may be designed to provide a linear, exponential, or other function as more transistors are turn "on". The p-channel transistors (502, 506, 510) and n-channel transistors (504, 508, 512) may be sized so that each transistor has a different resistance. For example, the transistor gate lengths may be increased (i.e., long channel transistors) to increase the inherent resistance of each transistor. A larger inherent resistance may be advantageous if both a p-channel transistor and a n-channel transistor are "on" simultaneously. In an embodiment of the present invention, the adjustment circuit (500) may include only one p-channel transistor (e.g., p-channel transistor (502)) and one n-channel transistor (e.g., n-channel transistor (504)) connected in series.

The adjustment circuit (500) in FIG. 5 may be used as the adjustment circuit (354) shown in FIG. 3. The multiple adjustment signals K (353 in FIG. 3) may represent EN_$N_X$ signals (503, 507, 511 in FIG. 5) and EN_$P_X$ signals (501, 505, 509 in FIG. 5). The multiple adjustment signals K (353 in FIG. 3) may turn "on" or "off" the p-channel transistors (502, 506, 510 in FIG. 5) and n-channel transistors (504, 508, 512 in FIG. 5) in the adjustment circuit (354 in FIG. 3). The common node, $V_{ADJ}$ (FIG. 5), of the adjustment circuit (354 in FIG. 3) may adjust the voltage on control voltage, $V_{BP}$ (309), in FIG. 3.

One of ordinary skill in the art will appreciate that even though adjustment circuits (500) may be connected to the output (control voltage $V_{BP}$ (309) in FIG. 3) of the bias-generator (308 in FIG. 3), it is possible that a few or none of the circuit elements included in adjustment circuit (500) may have an effect on the adjustable PLL (300 in FIG. 3), because adjustment circuit (354 in FIG. 3) may be turned "off". Furthermore, an adjustment circuit (500) may be operatively connected to the output (control voltage $V_{BP}$ (309) in FIG. 3) of the bias-generator (308 in FIG. 3) to affect a change in an operating characteristics of the adjustable PLL (300 in FIG. 3).

Figure 6A:
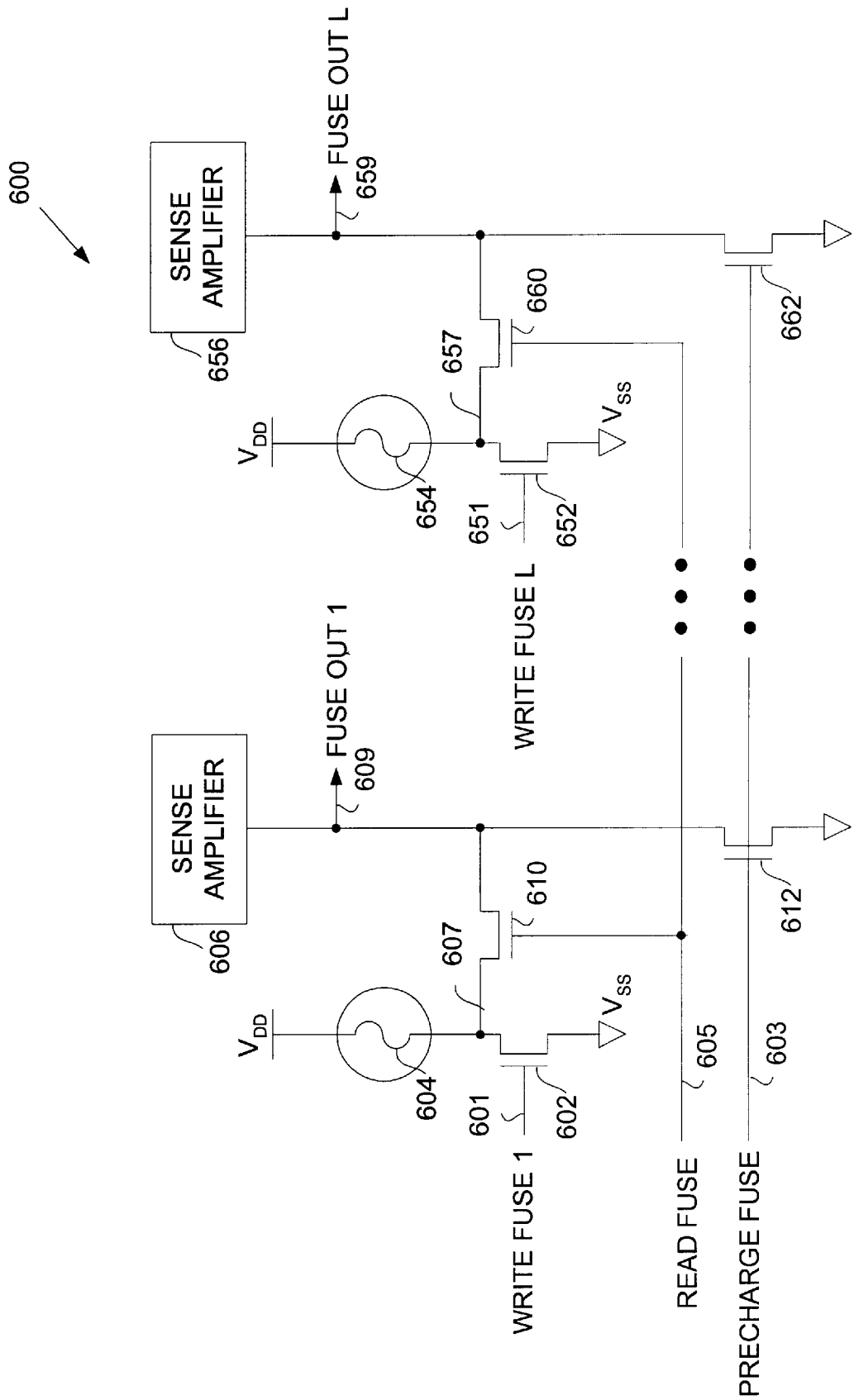
FIG. 6A shows a storage device schematic diagram in accordance with an embodiment of the present invention.

FIG. 6A shows an embodiment of a storage device (600) in accordance with the invention. The storage device (600) may be used for the storage device in the adjustable PLL shown at (358 in FIG. 3). The storage device (600) includes electrically programmable fuses (604, 654) to store nonvolatile control information.

In FIG. 6A, multiple write signals such as write fuse 1 (601) through write fuse L (651) are used to program electrically programmable fuses (604, 654), respectively. A "high" voltage on write fuse 1 (601) and write fuse L (651) cause n-channel transistors (602, 652), respectively, to turn "on." If n-channel transistors (602, 652) are "on" for a sufficient duration, the fuse (604) and fuse (654), respectively, will create an "open" circuit. A precharge fuse (603) signal will pulse a "high" voltage on the gates of n-channel transistors (612, 662) to momentarily turn them "on." If n-channel transistors (612, 662) are "on," fuse out 1 (609) and fuse out L (659) will be pulled to a "low" voltage by n-channel transistors (612, 662). The "low" voltage on fuse out 1 (609) and fuse out L (659) will precharge fuse out 1 (609) and fuse out L (659) in anticipation of a read operation.

In FIG. 6A, a "high" voltage on read fuse (605) will cause n-channel transistors (610, 660) to turn "on." If any of the fuses (604, 654) are intact (i.e., shorted), fuse out 1 (609) and fuse out L (659) will be pulled to a "high" voltage. If any of the fuses (604, 654) are open, fuse out 1 (609) and fuse out L (659) will remain at a "low" voltage. The sense amplifiers (606, 656) will sense the voltage levels on fuse out 1 (609) and fuse out L (659), respectively, to amplify and maintain the voltage levels.

Figure 6B:
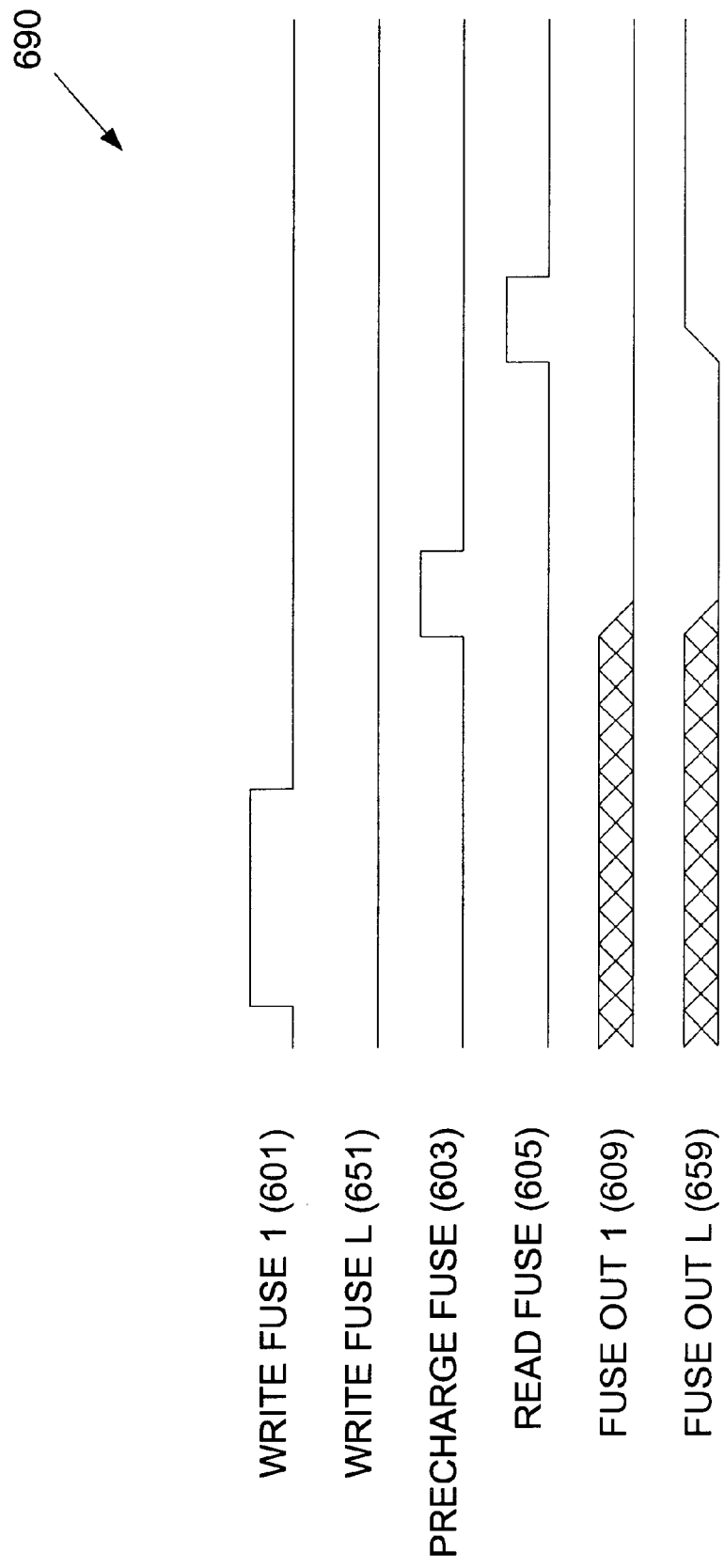
FIG. 6B shows a timing diagram in accordance with an embodiment of the present invention for the storage device schematic diagram shown in FIG. 6A.

FIG. 6B shows a timing diagram (690) related to the programming of storage device (600) in accordance with an embodiment of the present invention. In this example, write fuse 1 (601) is pulsed to a "high" voltage to create an "open" on fuse (604). Write fuse L (651) remains at a "low" voltage to leave fuse (604) intact. Precharge fuse (603) signal pulses a "high" voltage to pull fuse out 1 (609) and fuse out L (659) to a "low" voltage. Read fuse (605) pulses a "high" voltage to read the state of the fuses (604, 654). Because fuse (604) is "open", fuse out 1 (609) remains at a "low" voltage. Because fuse (654) is intact or "shorted", fuse out L (659) is pulled to a "high" voltage.

Because the fuses (604, 654) have been programmed and read, fuse out 1 (609) and fuse out L (659) maintain the programmed control information. The state of the fuses (604, 654) may be read at any time by observing the voltage level on fuse out 1 (609) and fuse out L (659). Also, the state of the fuses (604, 654) may be read by repeating the precharge and read cycles. Using multiple fuses and related circuitry, a binary word may represent the stored control information.

One of ordinary skill in the art will appreciate that the electrically programmed fuses are but one method to store information. The storage device (358 in FIG. 3) may contain a wide variety of types of storage elements including, but not limited to, an electrically programmable fuse, an electrically programmable read only memory, an electrically erasable read only memory, a one time programmable memory, a flash memory, a laser programmable fuse, and a laser programmable anti-fuse.

Figure 7:
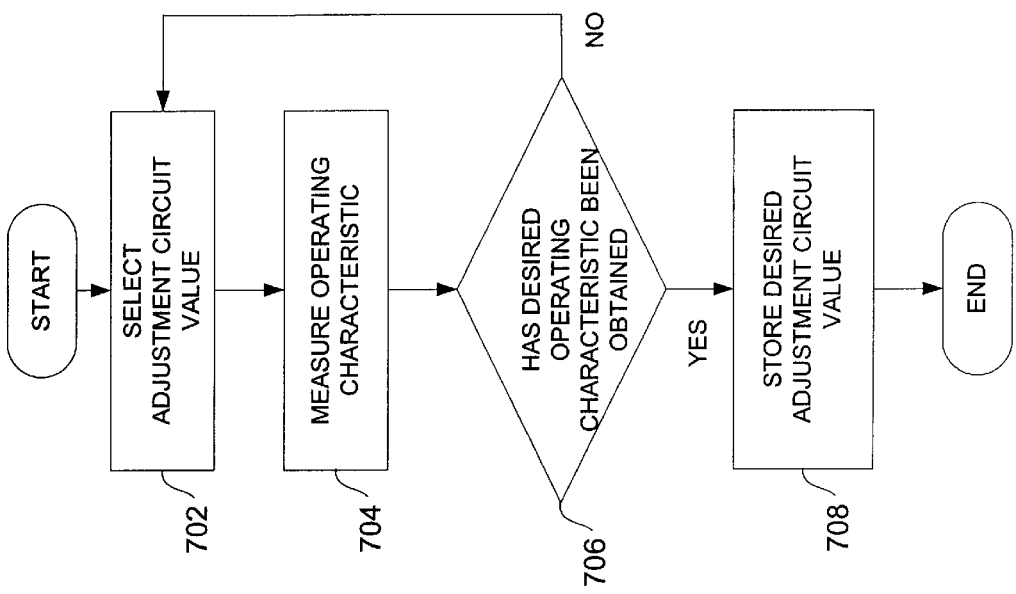
FIG. 7 shows a flow diagram in accordance with an embodiment of the present invention.

FIG. 7 shows a flow diagram in accordance with an embodiment of a method according to the invention. Initially, an adjustment circuit value is selected at (702). The selected adjustment value may be used to adjust adjustment circuit (354 shown in FIG. 3). The adjustment circuit (354 shown in FIG. 3) may create an offset in the voltage input to the voltage-controlled oscillator (310 in FIG. 3). The adjustment of the voltage input to the voltage-controlled oscillator (310 in FIG. 3) modifies an operating characteristic of the adjustable PLL (300 in FIG. 3). For example, the jitter of the adjustable PLL (300 in FIG. 3) may be measured as the system clock signal (FIG. 3) is jittered or the power supply noise is modified. Also, the performance of other circuits that rely on the adjustable PLL (300 in FIG. 3) may be measured. The operating characteristics are then measured (704).

Next, a determination as to whether a desired operating characteristic(s) is obtained (706). The determination may be based on an operating characteristic(s) taken with the selected adjustment circuit value, or an interpolation or extrapolation from data obtained from selectively adjusting the adjustment circuit value. If the desired operating characteristic(s) has not been obtained, these steps (702) and (704) are repeated until a desired operating characteristic(s) has been obtained (706). If the desired operating characteristic(s) has been obtained (706), the adjustment circuit value, or a representation of the value, is stored (708). The desired adjustment circuit value or representation of the value may be stored as control information in the storage device (358 in FIG. 3). The storage device (358 in FIG. 3) may contain control information that may be accessed and used to improve the performance of the adjustable PLL (300 in FIG. 3) after fabrication.

Advantages of the present invention may include one or more of the following. The adjustable PLL (300 in FIG. 3), having been fabricated, may demonstrate operating characteristics that may not have been apparent from simulation. In some embodiments, because the adjustment circuit (354 in FIG. 3) may modify the operating characteristics of the adjustable PLL (300 in FIG. 3), the adjustable PLL (300 in FIG. 3) may be calibrated.

In one or more embodiments, because the adjustable PLL (300 in FIG. 3) may be fabricated with a means for adjusting the voltage output of the bias-generator (308 in FIG. 3), fewer design iterations and higher confidence in the adjustable PLL (300 in FIG. 3) operating characteristics may be afforded. Likewise, the adjustable PLL (300 in FIG. 3) response to various system disturbances such as power supply noise and system clock signal jitter may be realistically determined and calibrated to minimize these effects.

In one or more embodiments, the tester (350 in FIG. 3) and test processor unit 352 in FIG. 3) may communicate so that the state of the adjustable PLL (300 in FIG. 3) may be obtained, performance characteristics analyzed, and/or adjustments made to the adjustable PLL (300 in FIG. 3). By using the tester (350 in FIG. 3), control information may be stored in a storage device (358 in FIG. 3).

In one or more embodiments, the tester (350 in FIG. 3) may take a relatively long time to determine the desired value and program the control information. Because the control information is programmed, the adjustable PLL (300 in FIG. 3) and the integrated circuit on which it resides may quickly (for example, within a few nanoseconds) adjust the adjustable PLL (300 in FIG. 3) to obtain proper operation.

In one or more embodiments, a limited number of adjustable PLLs (300 in FIG. 3) may need to be tested to determine the desired value for the control information for a larger number of adjustable PLLs (300 in FIG. 3).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:

a clock path for carrying a clock signal;

a power supply path for receiving power from a power supply;

a phase locked loop connected to the power supply path, comprising:

a voltage-controlled oscillator for generating a frequency signal dependent on an input thereto;

a phase-frequency detector for detecting a phase difference between the clock signal and the frequency signal; and a bias-generator arranged to output a voltage to an input of the voltage-controlled oscillator responsive to the phase-frequency detector;

an adjustment circuit operatively connected to the input of the voltage-controlled oscillator, wherein the adjustment circuit is responsive to control information to adjust the voltage output by the bias-generator;

a storage device for storing the control information to which the adjustment circuit is responsive; and a test processor unit operatively coupled to the storage device and the adjustment circuit.

2. An integrated circuit, comprising:

a clock path for carrying a clock signal;

a power supply path for receiving power from a power supply;

a phase locked loop connected to the power supply path, comprising:

a voltage-controlled oscillator for generating a frequency signal dependent on an input thereto;

a phase-frequency detector for detecting a phase difference between the clock signal and the frequency signal; and a bias-generator arranged to output a voltage to an input of the voltage-controlled oscillator responsive to the phase-frequency detector;

an adjustment circuit operatively connected to the input of the voltage-controlled oscillator, wherein the adjustment circuit is responsive to control information to adjust the voltage output by the bias-generator, and wherein the adjustment circuit comprises a first switch to provide current flow between a first voltage provided by the power supply path and the input of the voltage-controlled oscillator, and a second switch to provide current flow between a second voltage provided by the power supply path and the input of the voltage-controlled oscillator; and a storage device for storing the control information to which the adjustment circuit is responsive.

3. The integrated circuit of claim 1, wherein the adjustment circuit comprises a first p-channel transistor and a first n-channel transistor connected in series.

4. The integrated circuit of claim 3, the adjustment circuit further comprising:
   a second p-channel transistor connected in parallel with the first p-channel transistor; and
   a second n-channel transistor connected in parallel with the first n-channel transistor, wherein the first p-channel transistor and second p-channel transistor are in series with the first n-channel transistor and second n-channel transistor.

5. The integrated circuit of claim 1, wherein the storage device comprises a storage element selected from a group consisting of an electrically programmable fuse, an electrically programmable read only memory, an electrically erasable read only memory, a one time programmable memory, and a flash memory.

6. The integrated circuit of claim 1, wherein the storage device comprises a storage element selected from a group consisting of a laser programmable fuse and a laser programmable anti-fuse.

7. The integrated circuit of claim 1, wherein the control information comprises a binary word.

8. The integrated circuit of claim 1, wherein the control information comprises an instruction.

9. The integrated circuit of claim 1, further comprising:
   a tester adapted to communicate with the test processor unit, and read at least a portion of the control information in the storage device.

10. The integrated circuit of claim 1, further comprising:
    a tester adapted to communicate with the test processor unit, and write at least a portion of the control information in the storage device.

11. The integrated circuit of claim 1, wherein the adjustment circuit is connected to the input of the voltage-controlled oscillator with a wired-OR connection.

12. A method for post-fabrication treatment of a phase locked loop, comprising:
    generating a frequency signal;
    comparing the frequency signal to a clock signal;
    adjusting the generating based on the comparing using a bias-generator;
    generating a binary control word, wherein generating the binary control word is performed by a test processor unit;
    selectively adjusting an output of the bias-generator in the phase locked loop dependent on the binary control word;
    operating the phase locked loop, wherein the selectively adjusting the output of the bias-generator modifies an operating characteristic of the phase locked loop; and
    storing control information determined from the adjusting.

13. A method for post-fabrication treatment of a phase locked loop, comprising:
    generating a frequency signal;
    comparing the frequency signal to a clock signal;
    adjusting the generating based on the comparing using a bias-generator;
    generating a binary control word;
    selectively adjusting an output of the bias-generator in the phase locked loop dependent on the binary control word, and wherein the selectively adjusting the output of the bias-generator comprises controlling a first current flow between a first voltage and the output of the bias-generator, and controlling a second current flow between a second voltage and the output of the bias-generator;
    operating the phase locked loop, wherein the selectively adjusting the output of the bias-generator modifies an operating characteristic of the phase locked loop; and
    storing control information determined from the adjusting.

14. The method of claim 12, wherein the selectively adjusting the output of the bias-generator is performed by an adjustment circuit, wherein the adjustment circuit comprises a first switch to provide current flow between a first voltage and the output of the bias-generator, and a second switch to provide current flow between a second voltage and the output of the bias-generator.

15. The method of claim 12, wherein the selectively adjusting the output of the bias-generator is performed by an adjustment circuit, wherein the adjustment circuit comprises a first p-channel transistor and a first n-channel transistor, wherein the first p-channel transistor and the first n-channel transistor are connected in series.

16. The method of claim 15, the adjustment circuit further comprising:
    a second p-channel transistor connected in parallel with the first p-channel transistor; and
    a second n-channel transistor connected in parallel with the first n-channel transistor, wherein the first p-channel transistor and second p-channel transistor are in series with the first n-channel transistor and second n-channel transistor.

17. The method of claim 12, wherein the storing comprises at least one selected from a group consisting of electrically programming a fuse, electrically programming a read only memory, electrically erasing a read only memory, programming a one time programmable memory, and programming a flash memory.

18. The method of claim 12, wherein the storing comprises at least one selected from a group consisting of laser programming a fuse and laser programming an anti-fuse.

19. The method of claim 12, further comprising:
    reading the control information using a test processor unit; and
    operatively controlling the generating with the test processor unit.

20. The method of claim 12, further comprising:
    reading the control information; and
    instructing a test processor unit based on the control information to generate the binary control word.

21. The method of claim 12, wherein the control information represents an offset in the output of the bias-generator.

22. An integrated circuit, comprising:

phase locked loop means for generating a frequency signal, wherein the phase locked loop means comprises:
- means for generating the frequency signal,
- means for comparing the frequency signal to a clock signal,
- first means for adjusting the means for generating based on the means for comparing,
- a test processor unit for generating a binary control word,
- second means for adjusting an output of the first means in the phase locked loop dependent on the binary control word,
- means for operating the phase locked loop, wherein the second means modifies an operating characteristic of the phase locked loop; and storing means for storing control information determined using the second means.

* * * * *